United States Patent
Grillo

(10) Patent No.: US 6,833,740 B2
(45) Date of Patent: Dec. 21, 2004

(54) SINUSOIDAL FREQUENCY GENERATOR AND PERIODIC SIGNAL CONVERTER USING THEREOF

(75) Inventor: Lionel Grillo, Meylan (FR)

(73) Assignee: STMicroelectronics S.A., Montrouge (FR)

( * ) Notice: Subject to any disclaimer, the term of this patent is extended or adjusted under 35 U.S.C. 154(b) by 0 days.

(21) Appl. No.: 10/649,711

(22) Filed: Aug. 26, 2003

(65) Prior Publication Data

US 2004/0041600 A1 Mar. 4, 2004

(30) Foreign Application Priority Data

Aug. 30, 2002 (FR) .............................................. 0210747

(51) Int. Cl.[7] .............................................. H03L 7/06
(52) U.S. Cl. ................................... 327/129; 327/147
(58) Field of Search .................. 327/129, 147, 327/148, 155, 157, 162; 331/17, 25; 375/373, 374, 375, 376

(56) References Cited

U.S. PATENT DOCUMENTS

| | | | |
|---|---|---|---|
| 5,635,879 A | 6/1997 | Sutardja et al. ................ | 331/57 |
| 5,852,385 A | 12/1998 | Izumikawa .................... | 331/57 |
| 5,936,445 A | * 8/1999 | Babanezhad et al. ......... | 327/157 |
| 6,194,972 B1 | * 2/2001 | Brown ..................... | 331/108 B |
| 2001/0021230 A1 | 9/2001 | Myers et al. ................. | 375/295 |

FOREIGN PATENT DOCUMENTS

| | | | |
|---|---|---|---|
| EP | 0455298 | 11/1991 | ............ H03B/5/20 |
| EP | 0803985 | 10/1997 | ........... H03L/7/093 |

OTHER PUBLICATIONS

Wu J–T et al.; *"TP 5.2: A 2V 100MHZ CMOS Vector Modulator"*; IEEE International Solid–State Circuits Conference, IEEE Inc. New York, vol. 40, Feb. 1 1997, pp. 80–81, and 434, XP000753022.
French Preliminary Search Report dated May 15, 2003 for French Application No. 0210747.

* cited by examiner

*Primary Examiner*—Linh My Nguyen
(74) *Attorney, Agent, or Firm*—Lisa K. Jorgenson; Jon A. Gibbons; Fleit, Kain, Gibbons, Gutman, Bongini & Bianco P.L.

(57) ABSTRACT

A sinusoidal frequency generator comprising an oscillation circuit controlled by a control voltage, characterized in that the oscillating circuit is a gyrator made up of two transconductance amplifiers whose bias points are fixed by the control voltage in order to regulate oscillation frequency. The gyrator is easy to integrated in a phase control loop in order to realize a square-to-sinusoidal frequency converter.

14 Claims, 4 Drawing Sheets

SINUSOIDAL FREQUENCY GENERATOR AND PERIODIC SIGNAL CONVERTER USING THEREOF

CROSS REFERENCE TO RELATED APPLICATIONS

This application is based upon and claims priority from prior French Patent Application No. 0210747, filed Aug. 30, 2002, the disclosure of which is hereby incorporated by reference in its entirety.

BACKGROUND OF THE INVENTION

1. Field of the Invention

The present invention relates to circuits generating sinusoidal frequencies, and more particularly to a converter circuit generating a sinusoidal signal.

2. Description of Related Art

The implementation of sinusoidal signal generator circuits is well known in the background art. In general, to generate a sinusoidal signal, one frequently starts from a periodic square signal, generated by a digital frequency synthesizer; this signal is then filtered through one or more band-pass filters in order to extract its fundamental harmonic. The advantage of such a process lies in the fact that the frequency of the generated sinusoidal signal can be set to the frequency of the square signal, thus benefiting from digital synthesizers' precision. On the other hand, the large amount of odd harmonics contained in the periodic square signal makes filtering particularly difficult and it is then necessary to use more filters and to increase their complexity to reach a low distortion rate in the generated sine wave. Such complexity then results in a need for space on the semiconductor product, in an increased power consumption and finally in significantly high implementation costs.

However, in many circuits it is particularly desirable to benefit from the precision offered by a digital frequency synthesizer while preserving the purity of the generated sinusoidal signal. Then, the technical problem that must be solved consists in realizing a square-to-sinusoidal signal converter that is simple to implement and provides sufficient linearity for sophisticated applications, and in particular for frequency demodulator tuners. In addition, it would be desirable that the circuit could be easily incorporated into a semiconductor product.

Accordingly, a need exists to overcome the complexity of the prior art and to provide a sinusoidal signal generators circuit, which is easily to fabricate and works in a broad frequency range.

SUMMARY OF THE INVENTION

The present invention provides a sinusoidal signal generator circuit that is simple and inexpensive to implement.

Moreover, the present invention provides a square frequency converter, easy to incorporate into a semiconductor product and that makes it possible to generate a great quality sinusoidal signal in a broad frequency range.

The present invention includes of a sinusoidal frequency generator comprising an oscillating circuit based on the use of a gyrator. This gyrator consists of two transconductance amplifiers whose bias points are set by a control voltage ($V_{filt}$) in order to regulate the oscillation frequency. The gyrator is easy to insert in a phase control loop in order to produce a square-to-sinusoidal frequency converter.

Accordingly, the present invention provides a sinusoidal generator that reduces the complexities of the prior art implementations and that provides benefits from the high quality coefficient of the gyrator, which is realized.

Preferably, each transconductance amplifier comprises:
a differential stage composed of a first transistor and a second transistor whose gates constitute the input of the stage;
a third transistor and a fourth transistor constituting active charges for the first and second transistors, respectively;
a fifth transistor mounted as a power source for the differential stage.

The bias current of the third, fourth and fifth transistors is controlled by control voltage ($V_{filt}$).

In one embodiment, in, the bias point in each transconductance amplifier is controlled by a sixth transistor whose source is connected to a second reference voltage ($V_{dd}$) and whose drain receives control voltage ($V_{filt}$). A seventh transistor (307) has a source connected to reference voltage ($V_{dd}$) and a gate connected to the gates of the sixth, third and fourth transistors. An eighth transistor, whose source is connected to ground, has a drain and a gate connected to the drain of the seventh transistor and to the gate of the fifth transistor that constitutes the power source for the differential stage. Thus, control voltage ($V_{filt}$) controls the current in the sixth transistor, which current is then mirrored in the active charges composed of the third and fourth transistors, and in the power source formed by the fifth transistor.

Preferably, the signal generated by the gyrator is filtered by a filter having a structure similar to that of each of the amplifiers composing the gyrator, and whose bias point is also set by the control voltage ($V_{filt}$).

Thus, it is possible to generate a sine wave having a total harmonic distortion (THD) higher than 35 dB, in a broad frequency range, for example between 70 and 130 MHz.

In other embodiments filters are added before the generator, to allow filtering of the generated sine wave, as needed.

The circuit is particularly adapted to the realization of a frequency tuner for satellite or cable reception.

The invention also allows realization of a converter for converting periodic square signal into sinusoidal signal, by a gyrator mounted as an oscillator and whose bias point is set by a control voltage $V_{filt}$, the control voltage being generated by a phase control loop.

BRIEF DESCRIPTION OF THE DRAWINGS

The subject matter, which is regarded as the invention, is particularly pointed out and distinctly claimed in the claims at the conclusion of the specification. The foregoing and other features, and advantages of the invention will be apparent from the following detailed description taken in conjunction with the accompanying drawings.

DETAILED DESCRIPTION OF AN EMBODIMENT

Figure 1:
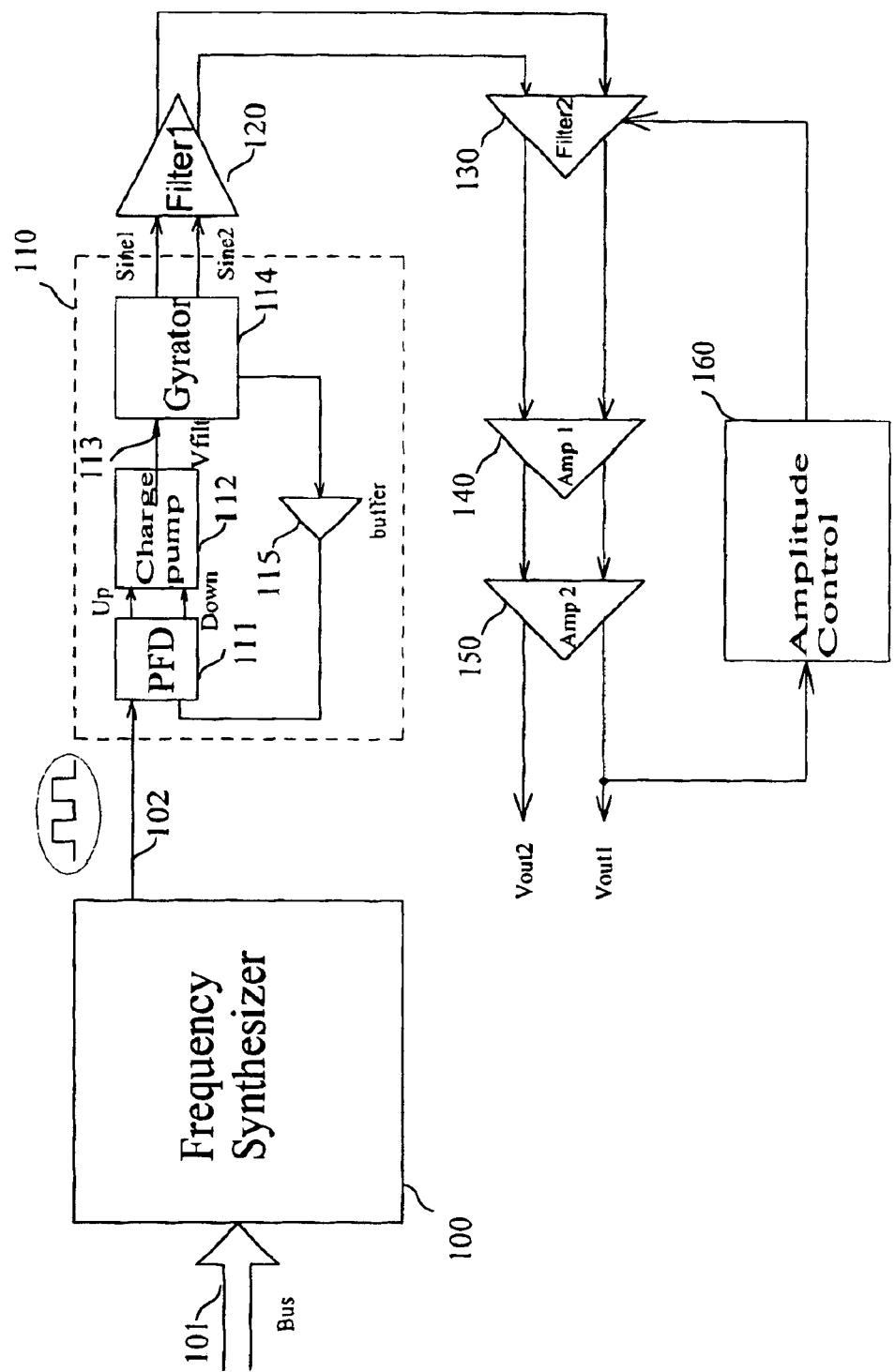
FIG. 1 is an electrical schematic of an embodiment of the digital signal converter, according to the present invention.

It should be understood that these embodiments are only examples of the many advantageous uses of the innovative teachings herein. In general, statements made in the specification of the present application do not necessarily limit any of the various claimed inventions. Moreover, some statements may apply to some inventive features but not to others. In general, unless otherwise indicated, singular elements may be in the plural and vice versa with no loss of generality. In the drawing like numerals refer to like parts through several views.

FIG. 1 is an electrical schematic of an embodiment of the digital signal converter, according to the present invention. A digital synthesizer 100 generates a periodic square signal 102 at a frequency that is determined according to the information presented to an input bus 101. Such a digital synthesizer is known to those of average skill in the art and need not be further described to understand the teachings of the present invention. The frequency synthesizer 100 is commercially available, in particular in the form of a dedicated integrated circuit. Generally, whether the frequency synthesizer 100 is a commercial circuit or a circuit especially adapted for a specific application, the synthesizer used generates a square signal in the desired frequency range. In one embodiment of the invention, the converter circuit is used to realize a cable reception tuner that will be directly integrated in a semiconductor product and, a frequency synthesizer allowing generation of square signals within a frequency range varying from 1 MHz to 216 MHz with a 432 Hz increment is used. Naturally, these values are only indicative and it is clear that people of average skill in the art are able to readily adapt the circuit of the invention to other frequency ranges and other possible embodiments, within the true scope and spirit of the present invention.

It should also be noted that the frequency synthesizer 100 is optional and in another embodiment is replaced by a fixed square frequency generator if in application with fixed frequency ranges.

The periodic square signal 102 is then transmitted to a converter 110 that will format periodic signal 102. To this end, converter 110 incorporates a gyrator 114 that is mounted as a voltage-frequency converter, i.e. as an oscillating circuit whose frequency is controlled by a bias voltage $V_{filt}$ 113. Preferably, gyrator 114 produces two differential components SINE1 and SINE2, one of which is coupled to a phase loop allowing frequency control of periodic signal 102. One of the components (for example SINE1) is back-fed to the input of a buffer element 115 that then outputs a periodic square signal that is compared with input signal 102 by a phase frequency detector (PFD) 111. PFD circuit 111 outputs two control signals, respectively a control signal UP and a control signal DOWN, according to the direction of the variation between buffer 115 output frequency and the frequency of periodic signal 102.

Control signals UP and DOWN are used to control a charge pump 112 that is used to generate a voltage $V_{filt}$ for controlling gyrator circuit 114.

The unit composed of gyrator 114, buffer 115, PFD circuit 111 and charge pump 112 comprises a sinusoidal generator whose frequency is controlled by the frequency of input signal 102.

Figure 2:
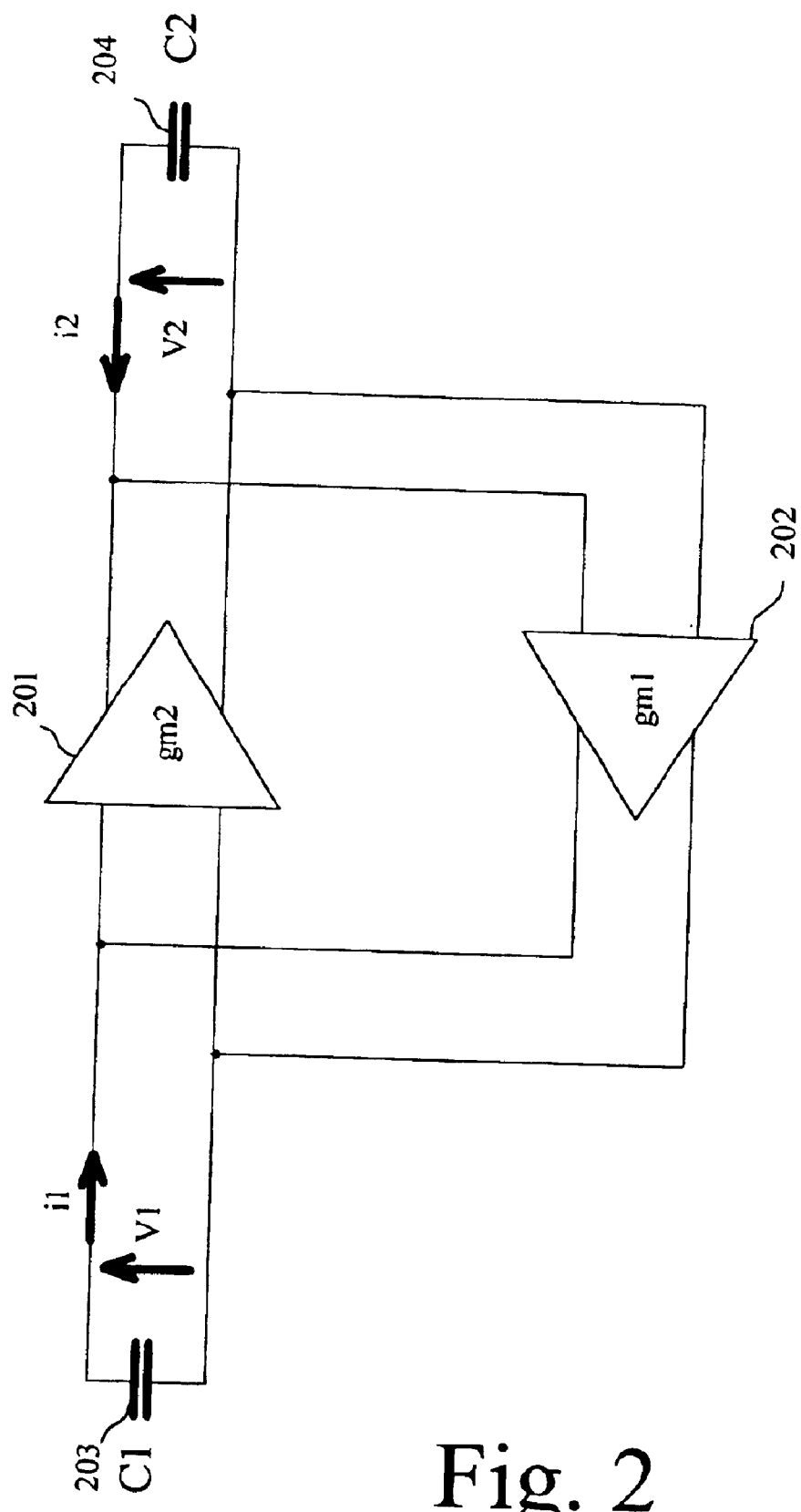
FIG. 2 is an electronic schematic of a gyrator of FIG. 1, according to the present invention.

FIG. 2 is an electronic schematic of a gyrator of FIG. 1, according to the present invention. The gyrator circuit is realized by a first transconductance amplifier 201 (having a coefficient gm2) and a second transconductance amplifier 202 (having a coefficient gm1). Each of transconductance amplifiers 201 and 202 comprises two differential inputs that are connected to the output of the other amplifier, and both operational amplifiers form together a four-pole assembly having the following characteristic equations:

$V_1 = -Z_1 \times I_1$ and $V_2 = Z_2 \times i_2$, on the one hand and $I_1 = gm1 \cdot v_2$ and $I_2 = -gm2 \times v_1$, on the other hand.

It results from the above:

$Z_2 = 1/(gm1 \times gm2 \times Z_1)$

Thus, it can be seen that impedance $Z_2$ on port 2 of this particular four-pole assembly is opposite to impedance $Z_1$ connected on port 1. Connecting a capacitor 203 ($C_1$) to the inputs of transconductance amplifier 201 allows simulation of an inductance $L = C_1/gm1 \times gm2$, and combining this inductance L with a second capacitor 204 ($C_2$) connected to the inputs of amplifier 202 creates an oscillating circuit.

Thus, an oscillating circuit is realized by a gyrator comprising two transconductance amplifiers whose bias point can be set by the control voltage $V_{filt}$ 113 generated by charge pump 112. Parameters gm1 and gm2 of both transconductance amplifiers can thus be modified, and then the frequency of the oscillating circuit realized by gyrator 114 is precisely controlled. This is a particularly advantageous way to obtain a new oscillating circuit whose oscillation frequency is adjusted so that it is controlled by input frequency 102, set precisely by frequency synthesizer 100. Preferably, identical capacity values will be chosen for $C_1$ and $C_2$.

When gyrator 114 is inserted in the phase loop embodied by buffer element 115 and phase frequency detector 111, a sinusoidal component of great quality can be produced, whose frequency is set to periodic square signal 102 through the phase loop control carried out by sinusoidal generator i.e., 111–115. Thus, sinusoidal signal frequency can be precisely set by frequency synthesizer 100.

Figure 3:
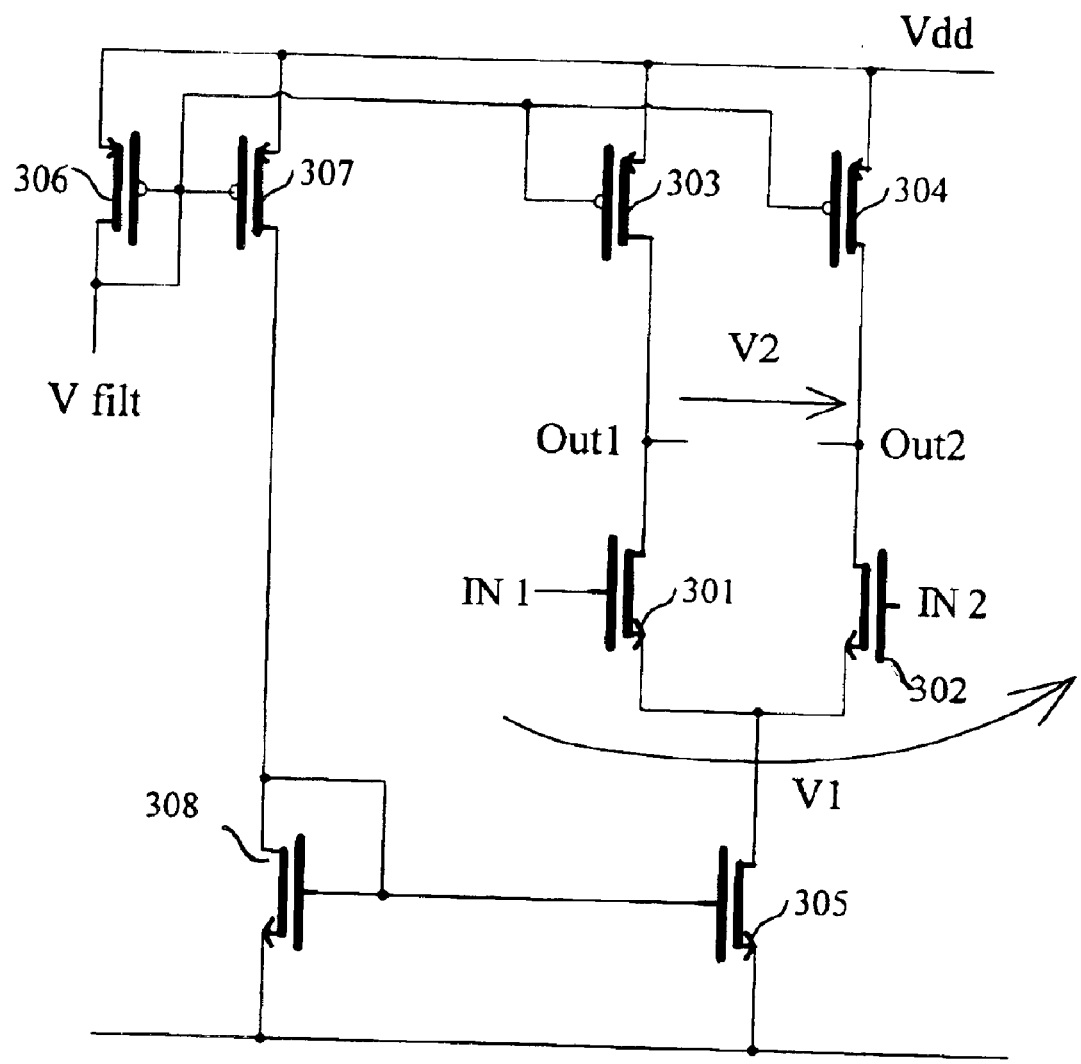
FIG. 3 is an electronic schematic of an exemplary embodiment of a transconductance amplifier, realized by MOS-type transistors, according to the present invention.

FIG. 3 is an electronic schematic of an exemplary embodiment of a transconductance amplifier, realized by MOS-type transistors, according to the present invention. In FIG. 3 shown is a particular embodiment of a transconductance amplifier enabling realization of gyrator 114, being understood that two similar amplifiers will be connected together in order to complete the four-pole assembly of FIG. 2. The transconductance amplifier comprises a differential pair made up of NMOS-type transistors 301 and 302, whose gates receive two inputs IN1 and IN2. The source of each NMOS-type transistor 301 and 302 is connected to the drain of an NMOS-type transistor 305 that is used as power source for the differential pair 301–302. Transistor 305 has a source connected to ground. The drain of transistor 301 (respectively 302) is connected, on the one hand, to the drain of a PMOS-type transistor 303 (respectively 304) whose source is connected to the supply voltage $V_{dd}$ and, on the other hand, to a first output OUT1 (respectively second output OUT2). The gates of transistors 303 and 304 are connected to the gate of a PMOS-type transistor 307 that has a source connected to supply voltage $V_{dd}$. Transistor 307 also has a drain connected to the drain and the gate of a NMOS-type transistor 308, and to the gate of transistor 305 that constitutes the power source for the differential pair 301 and 302. The source of transistor 308 is connected to a first reference voltage, such as ground, of the circuit.

Control voltage $V_{filt}$ 113 that is generated at the output of charge pump 112 (of FIG. 1) is presented to the drain of a PMOS-type transistor 306, whose source is connected to supply voltage $V_{dd}$. The gate of transistor 306 is connected to the gate of transistors 307, 303 and 304. Voltage $V_{filt}$ is also connected to the gate of transistors 306, 307, 303 and 304.

The transconductance amplifier operates as follows. Voltage $V_{filt}$ controls the current flowing in the drain of transistor 306, and consequently 307. Concretely, when control voltage $V_{filt}$ increases, transistor 307 becomes less conducting. The current that flows through transistor 307 is mirrored, with different coefficients that depend on the transistors' particular geometry, in current mirroring transistors 303 and 304 on one hand and, on the other hand, in transistors 307-308 that control power source 305. Thus, one has a very effective element for controlling the bias point of the transconductance amplifier and setting the transconductance amplifiers gm parameter. The connection between the gates of transistors 306 and 307 on the one hand, and the gates of transistors 303 and 304, on the other hand, allows realization of an active charge for the transconductance amplifier formed by transistor pair 301-302 and, this active charge provides oscillation when the amplifier is combined with a second amplifier of the same type (and to capacities $C_1$ and $C_2$) in order to realize the four-pole assembly illustrated in FIG. 2. For clarity's sake, in FIG. 3 the correspondence between voltage $V_1$ and the potentials of IN1 and IN2 on the one hand, and voltage $V_2$ and the potentials of OUT1 and OUT2 on the other hand, is illustrated. Both differential outputs of one of the transconductance amplifiers are used to generate components SINE1 and SINE2 as showed in FIG. 1.

Buffer element 115 of FIG. 1 is advantageously realized by a series of NMOS-type and PMOS-type elements whose gates are connected together—in order to regenerate a square signal necessary for comparison with the periodic signal input to 102.

Returning again to FIG. 1, we will now describe how to greatly improve the linearity of sine waves SINE1 and SINE2 by the processing described hereafter.

Figure 4:
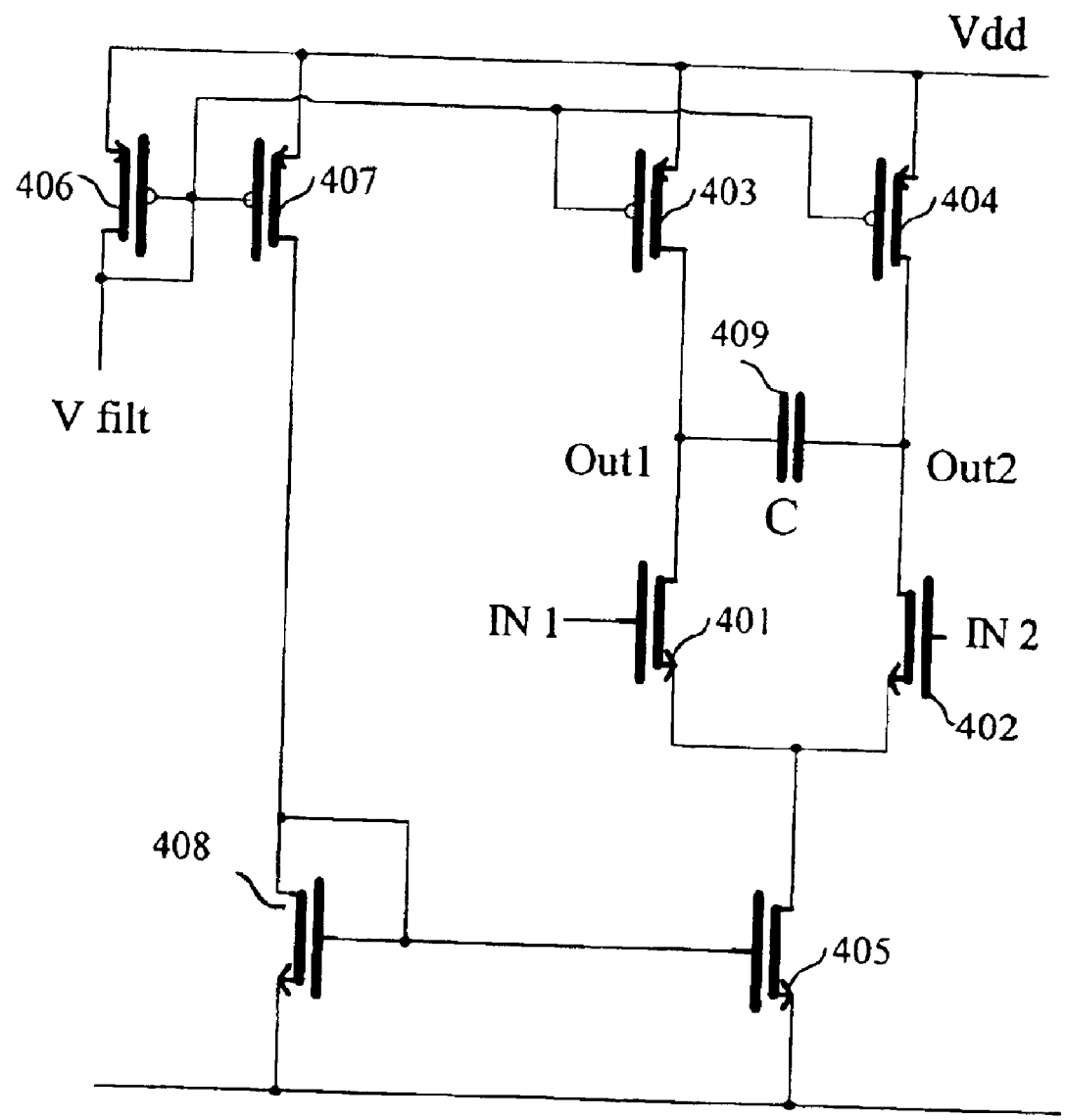
FIG. 4 is an electronic schematic of an embodiment of a first filter for filtering signals generated by gyrator of FIG. 1, according to the present invention.

First, both signals SINE1 and SINE2 are presented to the input of a low-pass filter 120 whose cut-off frequency is adjusted by the same control voltage $V_{filt}$ as the one used to control each amplifier of gyrator 114. To this end, as shown in FIG. 4, filter 120 is realized by a third transconductance amplifier having a structure similar to that of each amplifier composing gyrator 114. Transistors 401 to 408 correspond to transistors 301–308 of FIG. 3. More precisely, a differential pair consists of two transistors 401 and 402 whose gates receive inputs IN1 and IN2. Each transistor 401 (respectively 402) has a source connected to a power source transistor 405 and a drain connected to $V_{dd}$ via a transistor 403 (respectively 404). The gates of transistors 403 and 404 are connected to the gate of a transistor 407 whose source is connected to $V_{dd}$ and whose drain is connected to the gate and to the drain of a transistor 408, and also to the gate of transistor 405. Transistor 408 has a source that is connected to the ground level of the circuit. Voltage $V_{filt}$ is also connected to the gates of transistors 406, 407, 403 and 404.

As is the case for each of the two transconductance amplifiers that compose gyrator 114, control voltage $V_{filt}$ is presented to the drain of a transistor 406 whose source is connected to supply voltage $V_{dd}$. The gate of transistor 406 is connected to the gate of transistor 407 and to the gates of transistors 403 and 404. At the output of the differential pair 401-402, at least one capacitor 409 (C) is provided to realize low-pass filtering of filter 120. Thus, the bias points of this third transconductance amplifier are controlled in a particularly advantageous way, and in particular the currents of current mirroring circuits 403 and 404 are controlled by control voltage $V_{filt}$ that is also used to set the gyrator's oscillation frequency. Thus, parameter gm of the differential pair 401-402 is adjusted, and consequently the cut-off frequency of filter 120 is adjusted so that it corresponds perfectly to the oscillation frequency of gyrator 114. Thus, using a single setting—i.e., via the control voltage $V_{filt}$ generated by charge pump 112—the gyrator's oscillation frequency and the filtering operated by filter 120 is simultaneously controlled.

Optionally, components SINE1 and SINE2 generated and filtered by filter 120 are further processed. To this end, additional amplification associated with gain adjustment is carried out to bring the amplitude of the sine waves to a desired value. Referring again to FIG. 1, it can be seen that a second band-pass filter 130 can be used in series with first filter 120, followed by two fixed-gain amplifiers, respectively 140 (Amp1) and 150 (Amp2). An amplitude control circuit 160 makes it possible to measure signal amplitude on one of the sinusoidal components (for example $V_{out2}$) at the output of amplifier 150, and adjusts the effect of filter 130 in order to standardize this sine wave output amplitude. Preferably, amplitude control is realized, once again, by setting the bias current of the transistors composing second filter 130, by a control voltage generated by block 160. If the cut-off frequency of the filter is set sufficiently low (so that it is below the frequency range under consideration), additional filtering accompanied with variable gain can be obtained, the gain being simply adjusted by a control voltage provided by amplitude control circuit 160. Then it is not necessary to use variable gain amplifiers 140 and 150 to provide output signals $V_{out1}$ and $V_{out2}$ that have a standardized amplitude and further have remarkable linearity, with a distortion rate easily reaching 35 dB.

The differential pair 301 and 302 is based on NMOS-type transistors. Clearly, people qualified in the art will be able to adapt the description to built a pair of PMOS-type transistors by reversing the polarity of each transistor, within in the true scope and spirit of the present invention.

The above-described circuit of the invention is perfectly adapted to realize a frequency reception tuner that operates in a broad frequency range, and that can easily be incorporated into a semiconductor product.

Although a specific embodiment of the invention has been disclosed, it will be understood by those having skill in the art that changes can be made to this specific embodiment without departing from the spirit and scope of the invention. The scope of the invention is not to be restricted, therefore, to the specific embodiment, and it is intended that the appended claims cover any and all such applications, modifications, and embodiments within the scope of the present invention.

What is claimed is:

1. A sinusoidal frequency generator comprising:
   a digital synthesizer for generating an output signal having a variable frequency:
   a phase comparator with a first input and a second input which respectively receive the output signal from the digital synthesizer and a feedback squared signal;
   a charge pump circuit having an input connected to an output of the phase comparator wherein the charge pump generates a control voltage;
   an oscillating circuit controlled by the control voltage;
   wherein the oscillating circuit is a gyrator with two transconductance amplifiers; and
   wherein the two transconductance amplifiers each has a differential structure with an active load with a bias point fixed by the control voltage in order to regulate the oscillation frequency and for generating a signal having a sinusoidal form.

2. The generator according to claim 1, wherein each of the two transconductance amplifiers further comprise:

a differential stage composed of a first transistor and a second transistor each having a source, a drain and a gate, wherein the gate of the first transistor is the input of the first portion of a differential signal, and the gate of the second transistor is the input of the second portion of the differential signal;

a third transistor and a fourth transistor each having a source, a drain and a gate, wherein the gate of the third transistor and the fourth transistor providing an active charge for the first transistor and second transistor; and a fifth transistor with a source, a drain and a gate, and constituting a power source for the first transistor and the second transistor;

wherein a bias current of the third transistor, the fourth transistor, and the fifth transistor is controlled by the control voltage.

3. The generator according to claim 2, wherein the source of both the first transistor and the second transistor are connected to the drain of the fifth transistor;

wherein the source of the fifth transistor is connected to a first reference voltage;

wherein the drain of the first transistor is connected to the drain of the third transistor and the source of the third transistor is connected to a second reference voltage;

wherein the drain of the second transistor is connected to the drain of the fourth transistor and the source of the fourth transistor is connected to the second reference voltage;

wherein the gate of the third, the fourth and the fifth transistor is controlled by the control voltage.

4. The generator according to claim 3, wherein each of the two transconductance amplifiers further comprise:

a sixth transistor with a source, a drain, and a gate, the source of the sixth transistor connected to the second reference voltage, and the drain of the sixth transistor receiving the control voltage;

a seventh transistor with a source, a drain, and a gate, the source of the seventh transistor connected to the second reference voltage, the gate of the seventh transistor connected to the gate of the sixth transistor, the third transistor and the fourth transistor, and to the control voltage; and an eighth transistor with a source, a drain and a gate, the source of the eighth transistor connected to the first reference voltage, the drain and the gate of the eighth transistor both connected to the drain of the seventh transistor and to the gate of the fifth transistor.

5. The generator according to claim 1, further comprising:
a first filter composed of a third transconductance amplifier with a bias point fixed by the control voltage.

6. The generator according to claim 5, wherein the third transconductance amplifier further comprises:

a differential stage composed of a first transistor and a second transistor, wherein the first transistor and the second transistor of the differential stage each with a source, a drain, and a gate, and wherein the gate of the first transistor and the gate of the second transistor constituting the input of the differential stage;

a third transistor and a fourth transistor each having a source, a drain and a gate constituting an active charge for the first transistor and second transistor;

a fifth transistor with a source, a drain and a gate, and constituting a power source for the first transistor and the second transistor;

wherein a bias current of the third transistor, the fourth transistor and the fifth transistor is controlled by the control voltage.

7. The generator according to claim 6, wherein the source of the first transistor and the source of the second transistor are connected to the drain of the fifth transistor;

wherein the source of the fifth transistor is connected to a first reference voltage;

wherein the drain of the first transistor is connected to the drain of the third transistor and the source of the third transistor is connected to a second reference voltage;

wherein the drain of the second transistor is connected to the drain of the fourth transistor and the source of the fourth transistor is connected to the second reference voltage;

wherein the gate of the third transistor, the fourth transistor and the fifth transistor are controlled by the control voltage;

wherein the third amplifier further comprises:

a sixth transistor with a source, a drain and a gate electrode, the source of the sixth transistor connected to the second reference voltage, and the drain of the sixth transistor the control voltage;

a seventh transistor with a source, a drain and a gate, the source of the seventh transistor is connected to the second reference voltage, the gate of the seventh transistor is connected to the gate of the sixth transistor, the third transistor and the fourth transistor, and to the control voltage; and an eighth transistor with a source, a drain and a gate, the source of the eighth transistor is connected to the first reference voltage, and the drain and the gate of the eighth transistor both are connected to the drain of the seventh transistor and to the gate of the fifth transistor.

8. The generator according to claim 5, further comprising:

a second low-pass filter operating above a cut-off frequency of the second low-pass filter, the second low-pass filter comprising an amplifier with a bias point controlled by a voltage controlled by an amplitude control circuit in order to regulate the gain of the amplifier of the second low-pass filter.

9. A converter for converting periodic square signals into sinusoidal signals, comprising:

a phase comparator with a first input and a second input which respectively receive an output signal from a digital synthesizer and a feedback squared signal;

a charge pump circuit having an input connected to an output of the phase comparator wherein the charge pump generates a control voltage;

an oscillating circuit for generating a sine wave wherein the oscillating circuit is controlled by a control voltage; and a phase control loop including the phase comparator for comparing the sine wave feeding back to the phase comparator with a reference square signal at the first input;

wherein the oscillating circuit includes a gyrator composed of two transconductance amplifiers;

wherein the two transconductance amplifiers each has a differential structure with an active load with a bias points fixed by the control voltage in order to regulate oscillation frequency.

10. The converter according to claim 9, wherein the phase control loop comprises MOS-type transistors assembled as a buffer for generating a periodic square signal from analog outputs.

11. A semiconductor product comprising:
- a frequency reception turner including an oscillating circuit for generating a sine wave wherein the oscillating circuit is controlled by a control voltage; and
- a phase control loop including a phase detector for comparing the sine wave with a reference square signal;
- wherein the oscillating circuit includes a gyrator composed of two transconductance amplifiers whose bias points are fixed by the control voltage in order to regulate oscillation frequency.

12. The converter according to claim 11, wherein the phase control loop comprises MOS-type transistors assembled as a buffer for generating a periodic square signal from analog outputs.

13. The sinusoidal frequency generator of claim 1 further comprising:
- a buffer receiving the sinusoidal output signal for generating the squared feedback signal.

14. The converter according to claim 9 further comprising:
- a buffer receiving the sine wave for generating the squared feedback signal.

* * * * *